United States Patent [19]

Packer

[11] 4,143,005
[45] Mar. 6, 1979

[54] EXTRUDABLE, NON-FLOWING AND NON-AQUEOUS SOLVENT SOLUBLE HOLD DOWN COMPOUND FOR PRINTED WIRING BOARD ASSEMBLY

[75] Inventor: Marvin Packer, Bromall, Pa.

[73] Assignee: RCA Corporation, New York, N.Y.

[21] Appl. No.: 834,269

[22] Filed: Sep. 19, 1977

[51] Int. Cl.² ............................................. C08L 1/10
[52] U.S. Cl. ......................... 260/17 R; 228/180 R;
  260/18 R; 260/29.1 R; 260/31.2 R; 260/31.8 PQ
[58] Field of Search ............... 228/180 R; 260/17 R,
  260/18 R, 29.1 R, 31.2 R, 31.8 PQ

[56] References Cited
U.S. PATENT DOCUMENTS

| | | | |
|---|---|---|---|
| 2,973,499 | 2/1961 | Hammell | 339/17 |
| 3,230,612 | 1/1966 | Potter et al. | 29/155.55 |
| 3,540,718 | 11/1970 | Heffron et al. | 269/254 |
| 3,616,533 | 11/1971 | Heap et al. | 29/626 |
| 3,682,850 | 8/1972 | Coates | 260/17 R |
| 3,975,216 | 8/1976 | Stayner et al. | 228/170 |
| 4,028,143 | 6/1977 | Stayner et al. | 148/23 |
| 4,028,143 | 6/1977 | Stayner et al. | 228/180 R |
| 4,055,725 | 10/1977 | Boynton | 228/223 |

*Primary Examiner*—M. J. Welsh
*Attorney, Agent, or Firm*—H. Christoffersen; B. E. Morris; A. Stephen Zavell

[57] ABSTRACT

Components can be held down on a printed circuit board without lead clinching by applying an extrudable, non-flowing, heat resistant completely diluent-solvent soluble composition over and around the components to keep them in place during soldering operations. After soldering, the hold down compound is removed by a solvent rinse. The hold down compound comprises a carboxylic acid, a cellulose compound, a solid hydrocarbon resin, a thickening agent, and a non-aqueous diluent-solvent.

10 Claims, No Drawings

EXTRUDABLE, NON-FLOWING AND NON-AQUEOUS SOLVENT SOLUBLE HOLD DOWN COMPOUND FOR PRINTED WIRING BOARD ASSEMBLY

This invention relates to a method of assembling components on printed circuit boards. More particularly, this invention relates to an extrudable, diluent-solvent soluble composition and method of using said composition to hold components on printed circuit boards in place during soldering operations.

BACKGROUND OF THE INVENTION

In a general method of assembling components on printed circuit boards, the component leads are mounted through holes punched in the board for that purpose and the leads are then clinched, or bent, to hold the components in place during subsequent fluxing, lead cutting and soldering operations. The leads are soldered to the boards and the excess leads cut off. In many cases, the cut lead ends must be resoldered to cover them. These operations require hand labor and many steps, which is of course expensive. Also, solder is lost on the discharged lead ends. Further, when a double soldering step is required, the danger of board warping, due to the high temperatures involved in soldering, is increased.

With the increased complexity of electronic devices, more components are mounted on the boards, which creates more problems. The clinched leads on the boards interfere with each other, necessitating a stepwise component mounting whereby part of the components are assembled, soldered and their leads cut off before mounting additional components.

Further, it is more difficult to remove faulty components which must be replaced or repaired when the leads have been clinched, without damaging the board or other adjacent components. Still further, access to both sides of the board is required.

Thus, other ways of assembling printed circuit boards components without clinching leads have been sought. U.S. Pat. Nos. 2,973,499 and 3,230,612 describe adaptors or griplets which are fitted into the board holes and which receive the lead ends and pin or grip them to hold them in place. However, these methods require additional steps and parts which also add to the expense of manufacture.

U.S. Pat. No. 3,540,718 describes a component clamp and jig assembly whereby a sliced compressable pad, as of plastic foam, is pressed against the components to keep them in place during the soldering and lead cutting operation. This method is not entirely satisfactory either because it is difficult to maintain a uniform pressure against all components, which may differ greatly is size and weight. Also, the pad tends to become impregnated with flux and solder after several operations and requires extensive cleaning to retain its resiliency.

Other means of holding the components down by means of pressure have also been tried. When all the components are of nearly uniform size and weight, a bag loaded with small particles, e.g., beans or plastic shot, placed over the components will help keep them in place. However, this method is also unsatisfactory when both large and small components must be assembled in close proximity to each other, because the smaller components will not be held down properly and they may become loosened or even dislodged during soldering.

According to another method that has been tried, a molten wax coating is applied to the bottom of the board after the component leads have been inserted into the holes. After the wax cools and hardens, it holds the components in place while the leads are cut and soldered. This method has several advantages; it is particularly adapted to automatic soldering operations and the leads can be cut prior to soldering. The solder then covers all the lead ends in one operation. In addition, the wax acts as a flux for the soldering operation. The problems with the existing wax material are that the wax smokes during soldering, which is annoying to the operator, and the wax must be removed, either with organic solvents or with hot water, which requires a temperature over 150° F. (65.56° C.) which is expensive. In some instances also the soldering efficiency of the wax is inadequate for automatic soldering operations, necessitating the application of a second flux over the wax coating.

Applications Ser. Nos. 771,680, filed Feb. 24, 1977, and 771,679, filed Feb. 24, 1977, assigned to the same assignee, solve the above problems through the use of an extrudable, non-flowable, completely water soluble composition that can be readily applied over the components assembled on the printed circuit board to hold the components in place on the wiring board without lead clinching during the soldering operation. The compositions are suitable for the generally more acidic water soluble fluxes and water rinses but, due to insolubility in the non-aqueous diluent-solvents, are unsuitable if milder alcohol-soluble rosin fluxes and solvent rinses are necessary to prevent component corrosion. The terms printed circuit board and wiring board are interchangeable.

SUMMARY OF THE INVENTION

Extrudable, non-flowing, completely non-aqueous diluent-solvent soluble, low cost compositions, compatible with alcohol rosin fluxes, have been found that can be readily applied over components assembled on printed circuit boards that will maintain the components in place on the printed circuit board without clinching leads during soldering operations. The compositions are comprised of a carboxylic acid, a cellulose material, a hydrocarbon resin, a thickening agent, and a non-aqueous diluent-solvent. These ingredients can be mixed together with the diluent-solvent so as to obtain a non-flowing viscosity which can be extruded at room temperature.

DETAILED DESCRIPTION OF THE INVENTION

The carboxylic acids suitable for use in the invention must be compatible with the alcohol rosin flux and the other components in the composition. Compatible as employed herein means miscible and able to form a single phase system. In addition, the carboxylic acid must be soluble in the cleaning diluent-solvent used after the soldering operation. The carboxylic acid is employed for its acid constituent which is used to etch and clean the contacts which are to be soldered.

The concentration of the carboxylic acid is variable depending upon the consistency of the final composition desired. However, one of ordinary skill in the art would recognize that too high a concentration of the carboxylic acid would render the composition too fluid and therefore unacceptable while too little carboxylic acid would produce a dry composition which is not easily extrudable and has insufficient etching properties. Generally, the carboxylic acid concentration can vary between about 15 and 30 parts by weight and preferably about 20-24 parts by weight, based on 100 parts by weight of the total composition. Exemplary of suitable carboxylic acids are palmitic acid, levulinic acid, linoleic acid, and, preferably, oleic acid.

A cellulose material is added to provide sufficient film strength to the composition. Film strength is defined as the lack of shearing or cracking of the extruded composition after removal or evaporation of the solvent-diluent. The cellulose material must be soluble in the diluent and the cleaning solvent used after the soldering operation. The cellulose material tends to increase the resistance of the composition to removal by the solvent rinse, i.e., the greater the amount of cellulose material the longer the composition will have to be subjected to solvent rinse to remove the composition.

The cellulose material must be compatible with the carboxylic acid. Any cellulose material which meets the above criteria is considered to be within the scope of this invention. By way of example, if an oleic acid-trichloroethane diluent-solvent system were selected, then cellulose propionate, cellulose acetate butyrate and, preferably, an ethyl cellulose such as Ethocel #7 by the Eastman Kodak Co., would be compatible. In this system, methyl cellulose would not be compatible because it is not soluble in trichloroethane. This does not preclude the use of methyl cellulose in a different carboxylic acid-diluent system. The concentration of the cellulose may be varied from about 5-14 parts by weight and preferably about 7-11 parts by weight based on 100 parts by weight of the total composition.

The ratio of carboxylic acid to cellulose material gives an indication of ease of removal of the composition during the solvent rinsing step. Under conditions generally encountered with solder wave machines known in the prior art, a ratio of carboxylic acid to cellulose, such as oleic acid to ethyl cellulose, of less than about 2.25, while within the scope of the invention, will require longer rinse times or higher spraying pressures to remove the composition after soldering.

The hydrocarbon resin is used to control the viscosity of the composition, i.e., give body to the composition. Any solid hydrocarbon resin which is soluble in the solvent and is compatible with the other components in this composition is within the scope of the invention. The hydrocarbon resin concentration can vary from about 12-30 and preferably about 16-25 parts by weight based on 100 parts by weight of the total composition. The solid hydrocarbon resins employed within this invention generally may have a minimum viscosity of at least about 25 centistokes as determined by the Gardner Holt method of a solution of 75% hydrocarbon resin and 25% toluene.

The solid hydrocarbon resin utilized must permit the final composition to be readily extrudable and remain thick, i.e., not fluid, at the soldering temperature. An example of a suitable hydrocarbon resin is XL-30 of the Velsicol Chemical Corp. The hydrocarbon resin is low in olefinic unsaturation and has an average molecular weight of about 3400 and viscosity of 36 centistokes as determined by the Gardner Holt method of a solution 75% hydrocarbon resin and 25% toluene.

Other suitable hydrocarbon resins are XL-37, Polyvel G100 and Polyvel G110 of the Velsicol Chemical Corp; Hercules 6100 of the Hercules Chemical Corp.; and Nevchem 100 of the Neville Chemical Company.

Thickening agents must be added to give the final composition the proper yield structure and to control flow. Yield structure is defined as the ability to maintain an extrusion shape, i.e., round, square, rectangular, at the soldering temperature. If too little thickening agent is employed, the composition is too fluid to be extrudable. However, lack of extrudability does not preclude the possible use of the fluid composition to act as an adhesive after drying to hold down components inserted into the circuit board after application of the composition. If too much thickening agent is employed, the composition is too stiff to be easily extruded at room temperature. Any thickening agent which is compatible with the other components of the composition and soluble in the cleaning solvent is within the scope of this invention. The concentration of the thickening agent may be from about 5-12 parts by weight and preferably about 6.5-10.5 parts by weight based on 100 parts by weight of the total composition. A suitable thickening agent is glyceryl tris 1,2-hydroxy stearate (Thixcin R of the National Lead Co.). Neither the hydrocarbon resin nor the thickening agent alone are sufficient to provide the proper viscosity and yield structure to impart proper extrusion properties to the composition.

The diluent-solvent can be any commercially available solvent compatible with the other components of the composition. Diluent-solvent as used herein means any non-aqueous liquid compound(s) which is compatible with the composition of the invention and can be used in the rinsing operation of the soldering machine to remove the extrudable composition. The diluent-solvent chosen should have no solvent or limited solvent power for the components on the printed circuit board. In addition, it is desirable to choose a diluent-solvent that is sufficiently volatile so as to permit the composition to set up relatively quickly.

The diluent concentration can vary but generally should be between about 30-50 parts by weight and preferably about 35-45 parts by weight based on 100 parts by weight of the total composition. One skilled in the art will realize that the greater the amount of diluent-solvent employed or the less volatile the diluent, the longer the composition will take to set up. Set up is defined as the time after extrusion that the composition takes to develop adequate holding power.

Examples of appropriate diluent-solvents are chloroethane, i.e., (1,1,1-trichloroethane), tetrachloroethane, and perchloroethane.

The diluent-solvent is preferably the same as the cleaning or rinse solvent for the printed wiring boards. As used herein, the terms cleaning solvent and rinse solvent and diluent-solvent are synonyms.

Within the parameters of compatibility of the components and diluent-solvent solubility, the exact proportion of the several ingredients are not critical. As used herein, compatibility of the components means the composition is able to form a stable single phase system. These mixtures can be applied by extruding, as from a hand gun, over and around the mounted components. The mixtures do not flow into the lead holes, even after standing for several days, or when passed through a soldering operation which produces board surface temperatures of about 150° F. (65.56° C.) or higher. If, upon application, some of the composition should flow into the wiring board holes, the composition does not impair the solderability of the components to the wiring board.

These mixtures are completely solvent soluble and readily removed after the soldering operation by a rinse of cleaning solvent, without staining or corroding the printed circuit boards' surface or the components mounted thereon. The mixture is storable for long periods of time and is extrudable for at least 3 months. If the composition is stored past the useful extrusion life then the composition may be reconstituted by the addition of more of the original diluent-solvent or a different but equivalent diluent-solvent.

The compositions are compatible with rosins such as gum rosin, Tenex, Helix Rosin and Panbro, (trademarked products of Tenneco Chemical, Newport Division), and Pentalyn and Staybelite (trademarked products of Hercules, Inc.), etc.

In the method described of soldering components to printed circuit boards, whereby the foregoing mixtures are applied to the mounted component, the component soldered and the mixture washed away, an added advantage is that the component's leads may be pre-trimmed to a uniform length prior to the mounting on the boards, thus obviating the need for cutting leads after the components are mounted.

The invention will be further illustrated by the following Examples but it is to be understood that the invention is not limited to the details described therein. In the Examples, all parts are based on 100 parts by weight of the total composition and percentages are by weight.

EXAMPLE 1

Part A

A mixture was made of 21.9 parts of oleic acid, 8.6 parts of ethyl cellulose (Ethocel #7 of the Eastman Kodak Co.), 38.1 parts of 1,1,1-trichloroethane as the solvent and diluent, 21.2 parts of a hydrocarbon resin XL-30 of the Velsicol Chemical Corp. and 10.2 parts of a thickening agent Thixcin R of the National Lead Corp. The respective components were mixed together and allowed to stand for about ½ hour to permit sufficient diluent to evaporate to allow the composition to set up. The composition remains extrudable for at least three months.

Part B

The mixture of Example 1 formed a non-flowing, room temperature extrudable mixture which is applied to hold down variously sized components with pre-cut leads on printed circuit boards during fluxing with Kester #1571 flux, preheating and wave soldering operations at 260° C. with a 60% Sn–40% Pb solder. The mixture can be completely removed from soldered circuit boards which have been standing for several days by a warm solvent, 1,1,1-trichloroethane (Chlorothane) rinsing spray.

EXAMPLE 2

A mixture was made of 23.5 parts oleic acid, 9.2 parts ethyl cellulose, 32.6 parts of 1,1,1-trichloroethane as the diluent and solvent, 26.8 parts of a hydrocarbon resin XL-30 of the Velsicol Chemical Corp. and 7.8 parts of a thickening agent Thixcin R of the National Lead Corporation. The respective components were mixed together and allowed to stand for about ½ hour to permit sufficient diluent to evaporate to allow the composition to set up.

The mixture formed a solvent soluble, non-flowing, room temperature extrudable mixture which can be successfully used to hold components down on printed circuit boards during soldering operations.

COMPARATIVE EXAMPLE 1

A mixture was made of 18.5 parts oleic acid, 9.2 parts ethyl cellulose (Ethocel #7 of the Eastman Kodak Co.) 49.9 parts of 1,1,1-trichloroethane as the diluent and solvent, 22.2 parts of a hydrocarbon resin XL-30 of the Velsicol Chemical Corp., and no thickening agent. The respective components were mixed together and allowed to stand for about ½ hour to permit sufficient diluent-solvent to evaporate to allow the composition to set up.

The mixture formed a one phase fluid, marginally extrudable mixture which required extended drying time to afix components to the circuit board prior to soldering, and extended rinsing time after soldering to remove the composition. The carboxylic acid to cellulose ratio was 2.01 to 1.

COMPARATIVE EXAMPLE 2

A mixture was made of 21.5 parts oleic acid, 8.6 parts ethyl cellulose (Ethocel #7 of the Eastman Kodak Co.), 35.4 parts of 1,1,1-trichloroethane as the diluent and solvent, 21.0 parts of a hydrocarbon resin XL-30 of the Velsicol Chemical Corp., and 13.5 parts of a thickening agent Thixcin R of the National Lead Corporation. The respective components were mixed together and allowed to stand for about ½ hour to permit sufficient diluent to evaporate and allow the composition to set up.

This mixture contained an excess of Thixcin R. It was extrudable but too stiff, i.e., rested on top of the electronic components and would not flow around the composition on the printed circuit board.

COMPARATIVE EXAMPLE 3

A mixture was made of 16.9 parts oleic acid, 11.9 parts ethyl cellulose, (Ethocel #7 of the Eastman Kodak Co.), 50.0 parts of 1,1,1-trichloroethane as the diluent and solvent, 21.2 parts of a hydrocarbon resin XL-30 of the Velsicol Chemical Corp. and no thickening agent. The respective components were mixed together and allowed to stand for about ½ hour to permit sufficient diluent to evaporate to allow the composition to set up.

Without a thickening agent the mixture was too fluid, i.e., not enough of the mixture remained on the components at the soldering temperature to hold them in place. Extensive solvent washing time was required to remove the composition after soldering.

What I claim is:

1. In a method of soldering components to printed circuit boards comprising the steps of mounting the components leads into holes in the board, applying a coating to the components to maintain them in place, soldering the components to the board and removing said coating with a solvent rinse wherein the improvement comprises the step of applying as said coating a composition comprising an extrudable, non-flowable, solvent soluble coating containing a mixture of a carboxylic acid, a cellulose material, a solid hydrocarbon resin, a thickening agent and a non-aqueous diluent-solvent wherein each component of the composition is compatible with the other components and soluble in the solvent rinse.

2. A method according to claim 1 wherein said coating composition is applied by extrusion at room temperature.

3. An extrudable, non-flowing solvent soluble composition which comprises about 15-30 parts by weight of a carboxylic acid, about 5-14 parts by weight of a cellulose material, about 12-30 parts by weight of a solid hydrocarbon resin, about 5-12 parts by weight of a thickening agent, and about 30-50 parts by weight of a diluent (all parts by weight are based on 100 parts by weight of the total composition) wherein each of said components are mutally compatible and soluble in the diluent.

4. A composition according to claim 3 wherein the carboxylic acid is selected from the group consisting of oleic acid, levulinic and linoleic acid.

5. A composition according to claim 3 wherein the cellulose material is selected from the group consisting of cellulose acetate butyrate, cellulose propionate and ethyl cellulose.

6. A composition according to claim 3 wherein the hydrocarbon resin has a viscosity of at least about 25 centistokes as determined by the Gardner Holt method of a solution of 75% hydrocarbon resin and 25% toluene.

7. A composition according to claim 3 wherein the thickening agent is a glyceryl tris 1,2-hydroxy stearate.

8. A composition according to claim 3 wherein the solvent is selected from the group consisting of 1,1,1-trichloroethane, perchloroethane and tetrachloroethane.

9. An extrudable non-flowing solvent soluble composition comprising about 20-24 parts by weight of oleic acid, about 7-11 parts by weight of ethyl cellulose, about 35-45 parts by weight of 1,1,1-trichloroethane, about 16-25 parts by weight of a hydrocarbon resin wherein the resin has a viscosity of at least about 27 centistokes as measured by the Gardner Holt Method of a solution of 75% of said hydrocarbon resin and 25% toluene and about 6.5-10.5 parts by weight of glyceryl tris 1,2-hydroxy stearate, all parts by weight being based on 100 parts by weight of the total composition.

10. A method of soldering components to printed circuit boards which comprises:
 (a) mounting said components on a printed circuit board;
 (b) applying an extrudable, non-flowing, non-aqueous diluent-solvent soluble composition over said mounted components which comprises about 20-24 parts by weight of oleic acid, about 7-11 parts by weight of ethyl cellulose, about 35-45 parts by weight of 1,1,1-trichloroethane, about 16-25 parts by weight of a hydrocarbon resin with a viscosity of at least 27 centistokes as measured by the Gardner Holt Method of a solution of 75% of said hydrocarbon resin and 25% toluene, and about 6.5-10.5 parts by weight of a glyceryl tris 1,2-hydroxy stearate, all parts by weight being based on 100 parts by weight of the total composition;
 (c) fluxing the other side of the printed circuit board on which the composition of step (b) is extruded;
 (d) soldering the fluxed side of the printed circuit board of step (c);
 (e) removing the composition of step (b) with a solvent rinse.

* * * * *